United States Patent
Lee et al.

(10) Patent No.: US 9,178,181 B2
(45) Date of Patent: Nov. 3, 2015

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Yul-Kyu Lee, Yongin (KR); Kyung-Hoon Park, Yongin (KR); Sun Park, Yongin (KR); Joo-Hyeon Jo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/307,309

(22) Filed: Jun. 17, 2014

(65) Prior Publication Data

US 2015/0060792 A1  Mar. 5, 2015

(30) Foreign Application Priority Data

Aug. 27, 2013  (KR) .................. 10-2013-0102022

(51) Int. Cl.
*H01L 51/52* (2006.01)
*H01L 27/32* (2006.01)
*H01L 51/56* (2006.01)

(52) U.S. Cl.
CPC .......... *H01L 51/5275* (2013.01); *H01L 27/326* (2013.01); *H01L 51/56* (2013.01)

(58) Field of Classification Search
USPC ............................................ 257/40, E51.022
See application file for complete search history.

(56) References Cited

U.S. PATENT DOCUMENTS

| 7,098,590 | B2 | 8/2006 | Lim et al. | |
| 7,435,992 | B2 * | 10/2008 | Choi et al. | 257/72 |
| 8,704,235 | B2 * | 4/2014 | Kang et al. | 257/72 |
| 2008/0297043 | A1 * | 12/2008 | Nishikawa et al. | 313/504 |
| 2011/0042696 | A1 | 2/2011 | Smith et al. | |
| 2015/0115259 | A1 * | 4/2015 | Yamazaki et al. | 257/43 |

FOREIGN PATENT DOCUMENTS

| JP | 2011-76799 A | 4/2011 |
| KR | 10-2006-0125652 A | 12/2006 |
| KR | 10-2008-0047782 A | 5/2008 |

* cited by examiner

*Primary Examiner* — Thao P Le
(74) *Attorney, Agent, or Firm* — Christie, Parker & Hale, LLP

(57) ABSTRACT

An organic light-emitting display apparatus including: a substrate; at least one thin-film transistor disposed on the substrate; at least one capacitor disposed on the substrate and including a first electrode and a second electrode; a pixel electrode connected to the at least one thin-film transistor; a counter electrode facing the pixel electrode and including a reflective material; an organic emission layer disposed between the pixel electrode and the counter electrode; a first optical characteristic adjusting layer disposed between the substrate and the pixel electrode and formed on a same layer as the second electrode of the at least one capacitor; and a second optical characteristic adjusting layer disposed between the first optical characteristic adjusting layer and the pixel electrode.

28 Claims, 11 Drawing Sheets

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2013-0102022, filed on Aug. 27, 2013, in the Korean Intellectual Property Office, the disclosure of which is incorporated herein in its entirety by reference.

BACKGROUND

1. Field

One or more embodiments of the present invention relate to an organic light-emitting display apparatus and a method of manufacturing the same.

2. Description of the Related Art

An organic light-emitting display apparatus is a self-emission display apparatus that includes a hole injection electrode, an electron injection electrode, and an organic emission layer disposed between the hole injection electrode and the electron injection electrode, and emits light as holes injected from the hole injection electrode and electrons injected from the electron injection electrode are combined and excited in the organic emission layer. Since the organic light-emitting display apparatus has high quality characteristics, such as low power consumption, high luminance, and high response speed, the organic light-emitting display apparatus has received much attention as a next-generation display apparatus.

SUMMARY

Aspects of one or more embodiments of the present invention are directed towards an organic light-emitting display apparatus having high light efficiency and excellent color reproducibility, and a method of manufacturing the same.

Additional aspects will be set forth in part in the description which follows and, in part, will be apparent from the description, or may be learned by practice of the presented embodiments.

According to one or more embodiments of the present invention, an organic light-emitting display apparatus includes: a substrate; at least one thin-film transistor disposed on the substrate; at least one capacitor disposed on the substrate and including a first electrode and a second electrode; a pixel electrode connected to the at least one thin-film transistor; a counter electrode facing the pixel electrode and including a reflective material; an organic emission layer disposed between the pixel electrode and the counter electrode; a first optical characteristic adjusting layer disposed between the substrate and the pixel electrode and formed on a same layer as the second electrode of the at least one capacitor; and a second optical characteristic adjusting layer disposed between the first optical characteristic adjusting layer and the pixel electrode.

The pixel electrode may include a semi-transmissive material.

The pixel electrode may include a transparent material.

The pixel electrode may be patterned into a mesh pattern.

The first optical characteristic adjusting layer may include a transparent conductive oxide.

The first optical characteristic adjusting layer may include a same material as the second electrode of the at least one capacitor.

The first optical characteristic adjusting layer may be patterned into an island pattern.

The second optical characteristic adjusting layer may include a semi-transmissive material.

The second optical characteristic adjusting layer may include a transparent material.

The second optical characteristic adjusting layer may be patterned into an island pattern.

The organic light-emitting display apparatus may further include a first pad layer and a second pad layer disposed on the first pad layer, wherein the second optical characteristic adjusting layer may be disposed on a same layer as the second pad layer.

The second optical characteristic adjusting layer may include a same material as the second pad layer.

The pixel electrode, the first optical characteristic adjusting layer, and the second optical characteristic adjusting layer may be disposed on a path of light emitted from the organic emission layer.

The at least one thin-film transistor may include an active layer, a gate electrode, source and drain electrodes, a first insulating layer disposed between the active layer and the gate electrode, and a second insulating layer disposed between the gate electrode and the source and drain electrodes, wherein the active layer may be disposed on a same layer as the first electrode of the at least one capacitor, and the gate electrode may be disposed on a same layer as the second electrode of the at least one capacitor.

The second insulating layer may be disposed between the first optical characteristic adjusting layer and the second optical characteristic adjusting layer.

A third insulating layer may be disposed between the pixel electrode and the source and drain electrodes, and the third insulating layer may be disposed between the second optical characteristic adjusting layer and the pixel electrode.

According to one or more embodiments of the present invention, a method of manufacturing an organic light-emitting display apparatus, the method includes: forming an active layer of a thin-film transistor and a first electrode of a capacitor on a substrate; forming a first optical characteristic adjusting layer and a second electrode of the capacitor; forming a gate electrode of the thin-film transistor; forming source and drain electrodes of the thin-film transistor and a first pad layer; forming a second optical characteristic adjusting layer and a second pad layer; forming a pixel electrode connected to one of the source and drain electrodes; forming an organic emission layer on the pixel electrode; and forming a counter electrode on the organic emission layer.

The method may further include doping ion impurities on the active layer and the first electrode of the capacitor.

The ion impurities may be doped after forming the gate electrode.

The first optical characteristic adjusting layer and the second electrode of the capacitor may be formed of a transparent material.

The first optical characteristic adjusting layer may be patterned into an island pattern.

The second optical characteristic adjusting layer and the second pad layer may be formed of a semi-transmissive material.

The second optical characteristic adjusting layer and the second pad layer may be formed of a transparent material.

The second optical characteristic adjusting layer may be patterned into an island pattern.

The pixel electrode may be patterned into an island pattern.

The pixel electrode may be formed of a semi-transmissive material.

The pixel electrode may be formed of a transparent material.

The counter electrode may be formed of a reflective material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
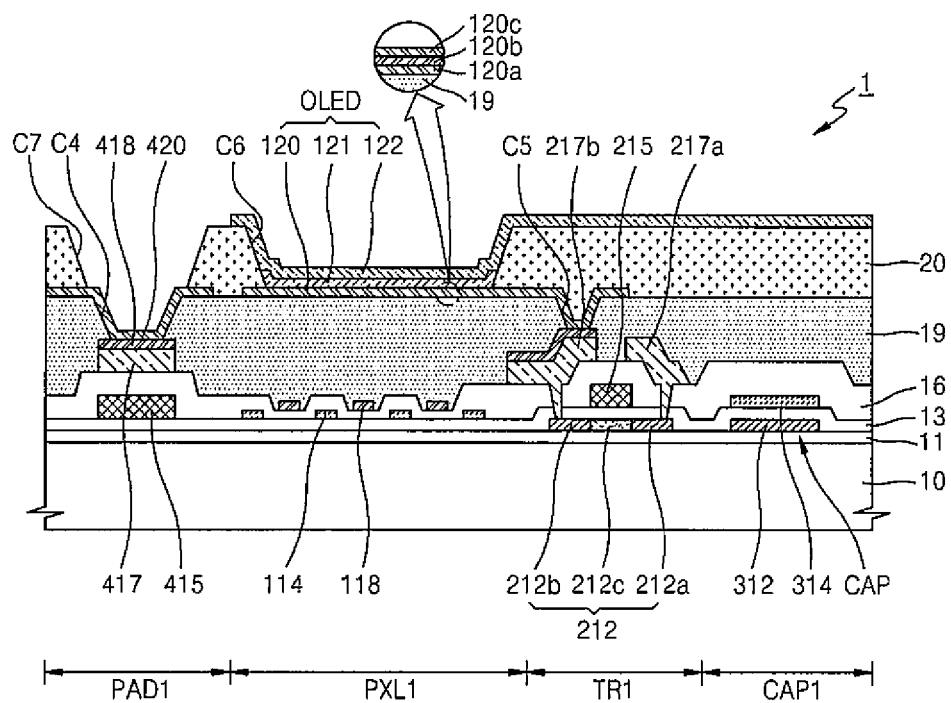
FIG. 1 is a cross-sectional view of an organic light-emitting display apparatus according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Expressions such as "at least one of," when preceding a list of elements, modify the entire list of elements and do not modify the individual elements of the list. Further, the use of "may" when describing embodiments of the present invention refers to "one or more embodiments of the present invention."

FIG. 1 is a cross-sectional view of an organic light-emitting display apparatus 1 according to an embodiment of the present invention.

Referring to FIG. 1, the organic light-emitting display apparatus 1 according to the current embodiment includes a pixel region PXL1 including at least one organic emission layer 121 on a substrate 10, a transistor region TR1 including at least one thin-film transistor, a capacitor region CAP1 including at least one capacitor, and a pad region PAD1.

In the transistor region TR1, a buffer layer 11 is disposed on the substrate 10, and a thin-film transistor is disposed on the buffer layer 11.

The substrate 10 may be a glass substrate or a plastic substrate including polyethylene terephthalate (PET), polyethylene naphthalate (PEN), or polyimide.

The buffer layer 11 may be disposed on the substrate 10 so as to flatten a top surface of the substrate 10 and block impure elements from penetrating into the substrate 10. The buffer layer 11 may be a single layer or a multiple layer including a silicon nitride and/or a silicon oxide.

The thin-film transistor includes an active layer 212, a gate electrode 215, a source electrode 217a, and a drain electrode 217b.

The active layer 212 may include a channel region 212c, and source and drain regions 212a and 212b formed by doping ion impurities outside the channel region 212c. The active layer 212 may include a variety of materials. For example, the active layer 212 may include an inorganic semiconductor material such as amorphous silicon or crystalline silicon. In another example, the active layer 212 may include an oxide semiconductor material. Also, in another example, the active layer 212 may include an organic semiconductor material.

A first insulating layer 13, that is, a gate insulating film, is formed on the active layer 212, and the gate electrode 215 is disposed on the first insulating layer 13 at a location corresponding to the channel region 212c.

The gate electrode 215 may be a single layer or a multiple layer including at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A second insulating layer 16, that is, an interlayer insulating film, is formed on the gate electrode 215, and the source and drain electrodes 217a and 217b are disposed on the second insulating layer 16.

The source and drain electrodes 217a and 217b are respectively connected to the source and drain regions 212a and 212b of the active layer 212 through an opening formed on the second insulating layer 16. Each of the source and drain electrodes 217a and 217b may be a single layer or a multiple layer including at least one metal selected from among Al, Pt, Pd, Ag, Mg, Au, Ni, Nd, Ir, Cr, Li, Ca, Mo, Ti, W, and Cu.

The first and second insulating layers 13 and 16 may be an inorganic insulating film. Each of the first and second insulating layers 13 and 16 may be a single layer or a multiple layer including at least one insulating material selected from among silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), zirconium oxide (ZrO2), barium strontium titanate (BST), and lead zirconate titanate (PZT).

A third insulating layer 19 is formed on the second insulating layer 16 to cover the source and drain electrodes 217a and 217b. The third insulating layer 19 may be a single layer or a multiple layer including inorganic insulating film and/or organic insulating film.

A pixel electrode 120 connected to the drain electrode 217b of the thin-film transistor on the third insulating layer 19, a counter electrode 122 facing the pixel electrode 120, and an organic light-emitting diode OLED including the organic emission layer 121 and disposed between the pixel electrode 120 and the counter electrode 122 are formed in the pixel region PXL1.

The thin-film transistor of FIG. 1 is a driving transistor for driving the organic light-emitting diode OLED. The driving transistor is shown in FIG. 1, but the organic light-emitting display apparatus 1 according to the current embodiment may further include a switching transistor or a compensation transistor.

A structure of the thin-film transistor shown in FIG. 1 is only an example, and thus, the current embodiment is not limited thereto.

In the current embodiment, the pixel electrode 120 includes a semi-transmissive material. In more detail, the pixel electrode 120 includes a semi-transmissive metal layer 120b. Transparent conductive oxide layers 120a and 120c may be further respectively disposed on a top and a bottom of the semi-transmissive metal layer 120b (i.e., the semi-transmissive layer 120b is between the transparent oxide layers 120a and 120c).

The semi-transmissive metal layer 120b may be formed of Ag or an Ag alloy. The semi-transmissive metal layer 120b may form a micro-cavity structure with the counter electrode 122 so as to improve light efficiency of the organic light-emitting display apparatus 1. As described below, the counter electrode 122 is a reflective electrode. The transparent conductive oxide layers 120a and 120c may include at least one selected from the group consisting of indium tin oxide (ITO), indium zinc oxide (IZO), zinc oxide (ZnO), indium oxide (In2O3), indium gallium oxide (IGO), and aluminum zinc oxide (AZO).

The transparent conductive oxide layer 120a disposed on the bottom of the semi-transmissive metal layer 120b may reinforce adhesive strength between the pixel electrode 120 and the third insulating layer 19.

The transparent conductive oxide layer 120c disposed on the top of the semi-transmissive metal layer 120b may operate as a barrier layer for protecting the semi-transmissive metal layer 120b.

A fourth insulating layer 20, that is, an organic insulating film, may be disposed on the third insulating layer 19. The fourth insulating layer 20 covers an outer boundary of the pixel electrode 120, and operates as a pixel define layer. The fourth insulating layer 20 may be an organic insulating film.

The organic emission layer 121 is disposed in an opening C6 formed in the fourth insulating layer 20. The organic emission layer 121 may include a low molecular organic material, a high molecular organic material, or a hybrid organic material in which a low molecular organic material and a high molecular organic material are mixed.

Although not shown in FIG. 1, at least one of a hole injection layer (HIL), a hole transport layer (HTL), an electron transport layer (ETL), and an electron injection layer (EIL) may be further disposed between the pixel electrode 120 and the counter electrode 122, as well as the organic emission layer 121. However, the current embodiment is not limited thereto, and other various functional layers may be further disposed.

The organic light-emitting diode OLED of FIG. 1 is an example of a sub-pixel forming a unit pixel, and the sub-pixel may emit light of any color. For example, the sub-pixel may emit red, green, or blue light.

In another example, the sub-pixel may emit white light. When the sub-pixel emits white light, the organic light-emitting display apparatus 1 may further include a color converting layer or a color filter for converting the white light into color light. The sub-pixel emitting the white light may have a variety of structures, for example, a structure in which at least a light-emitting substance emitting red light, a light-emitting substance emitting green light, and a light-emitting substance emitting blue light are stacked on one another.

In another example of the sub-pixel emitting white light, the sub-pixel may include a structure in which at least a light-emitting substance emitting red light, a light-emitting substance emitting green light, and a light-emitting substance emitting blue light are mixed.

The red, green, and blue colors are exemplary and the present embodiment is not limited thereto. In other words, any combination of other various colors, which is capable of emitting white light, may be employed in addition to a combination of red, green, and blue colors.

The counter electrode 122 is disposed on the organic emission layer 121 as a common electrode commonly formed throughout pixels. In the organic light-emitting display apparatus 1 according to the current embodiment, the pixel electrode 120 is used as an anode, and the counter electrode 122 is used as a cathode. However, polarities of the electrodes may be switched.

The counter electrode 122 is a reflective electrode including a reflective material. The counter electrode 122 may include at least one material selected from among Al, Mg, Li, Ca, LiF/Ca, and LiF.

Since the counter electrode 122 is a reflective electrode and the pixel electrode 120 is a semi-transmissive electrode, light emitted from the organic emission layer 121 is reflected by the counter electrode 122 and part of the light reflected by the counter electrode 122 penetrates through the pixel electrode 120, that is, the semi-transmissive electrode. Then, part of the light is emitted towards the substrate 10 and other part of the light is reflected by the pixel electrode 120. The light reflected by the pixel electrode 120 is partially reflected again by the counter electrode 122, and the light reflected by the counter electrode 122 is again partially reflected by the pixel electrode 120, thereby generating a resonance phenomenon. The light efficiency of the organic light-emitting display apparatus 1 may be increased by using the resonance phenomenon. Hereinafter, the resonance phenomenon generated between the counter electrode 122, that is, the reflective electrode, and the pixel electrode 120, that is, the semi-transmissive electrode, is referred to as a strong resonance phenomenon.

A first optical characteristic adjusting layer 114 and a second optical characteristic adjusting layer 118 are disposed between the pixel electrode 120 and the substrate 10 on a path of the light emitted from the organic emission layer 121.

The first optical characteristic adjusting layer 114 may be disposed between the first insulating layer 13, that is, a gate insulating film, and the second insulating layer 16, that is, an interlayer insulating film.

The first optical characteristic adjusting layer 114 includes the same material as a second electrode 314 of a capacitor to be described later, and is formed on the same layer as the second electrode 314. The first optical characteristic adjusting layer 114 may be formed of a transparent conductive oxide including at least one material selected from the group consisting of ITO, IZO, ZnO, In2O3, IGO, and AZO.

The second optical characteristic adjusting layer 118 is disposed between the first optical characteristic adjusting layer 114 and the pixel electrode 120. The third insulating layer 19 is disposed between the second optical characteristic adjusting layer 118 and the pixel electrode 120.

The second optical characteristic adjusting layer 118 includes the same material as a second pad layer 418 of the pad region PAD1 to be described later, and is formed on the same layer as the second pad layer 418. The second optical characteristic adjusting layer 118 includes a transparent conductive oxide like the first optical characteristic adjusting layer 114.

Light that passed through the pixel electrode 120 from among light emitted from the organic emission layer 121 is emitted towards the substrate 10 through the third insulating layer 19, the second insulating layer 16, the first insulating layer 13, and the buffer layer 11. Also, part of the light emitted from the organic emission layer 121 passes through the first optical characteristic adjusting layer 114 and the second optical characteristic adjusting layer 118. Light passing through a plurality of structures having different refractive indexes generates a resonance phenomenon, wherein part of the light that passes through and the other part is reflected at boundaries of the structures having different refractive indexes. Thus, the light efficiency slightly increases although less than the strong resonance phenomenon described above. Hereinafter, a resonance phenomenon generated between an optical characteristic adjusting layer and a plurality of insulating layers having different refractive indexes is referred to as a weak resonance phenomenon.

When a strong resonance phenomenon is used, the light efficiency is highly increased, but a display quality may be decreased due to a color shift phenomenon. However, when a weak resonance phenomenon is used, the color shift phenomenon may be reduced. In other words, by using the weak resonance phenomenon, color reproducibility is improved.

Since the organic light-emitting display apparatus 1 according to the current embodiment uses both the strong resonance phenomenon between the pixel electrode 120 that is a semi-transmissive electrode and the counter electrode 122 that is a reflective electrode and the weak resonance phenomenon between an optical characteristic adjusting layer and a plurality of refractive layers between the pixel electrode 120 and the substrate 10, the light efficiency and the color reproducibility of the organic light-emitting display apparatus 1 are excellent.

Also, according to the current embodiment, the first and second optical characteristic adjusting layers 114 and 118 are each patterned into an island pattern (shape) so as to further reduce a color shift phenomenon caused by the strong resonance phenomenon.

The capacitor region CAP1 may include a capacitor CAP including a first electrode 312 and the second electrode 314.

The first electrode 312 of the capacitor CAP is disposed on the same layer as the active layer 212 of the thin-film transistor. The first electrode 312 of the capacitor CAP may be formed of an ion impurity-doped semiconductor, like the source and drain regions 212a and 212b of the active layer 212.

The second electrode 314 of the capacitor CAP is disposed on the same layer as the first optical characteristic adjusting layer 114. The second electrode 314 of the capacitor CAP may include a transparent conductive oxide.

The first insulating layer 13 is disposed between the first and second electrodes 312 and 314 of the capacitor CAP, and may operate as a dielectric film of the capacitor CAP.

The pad region PAD1, that is, a connection terminal of an external driver, is disposed outside a display region.

A first pad layer 417 formed on a same layer as a source electrode 217a and a drain electrode 217b, and the second pad layer 418 formed on a same layer as the second optical characteristic adjusting layer 118 are disposed in the pad region PAD1. Also, a third pad layer 415 formed on the same layer as a gate electrode 215 and/or a fourth pad layer 420 formed on the same layer as the pixel electrode 120 may be further disposed in the pad region PAD1.

The first pad layer 417 may include the same material as the source and drain electrodes 217a and 217b of the thin-film transistor. For example, the first pad layer 417 may be a single layer or a multiple layer including at least one metal selected from among Al, Pt, Pd, Ag, Mg, Au, Ni, Nd, Ir, Cr, Li, Ca, Mo, Ti, W, and Cu.

The second pad layer 418 may include a same material as the second optical characteristic adjusting layer 118. For example, the second pad layer 418 may include a transparent conductive oxide. The second pad layer 418 may prevent the first pad layer 417 from being oxidized and diffused.

A method of manufacturing the organic light-emitting display apparatus 1 of FIG. 1 will now be described with reference to FIGS. 2A through 2J.

Figure 2A:
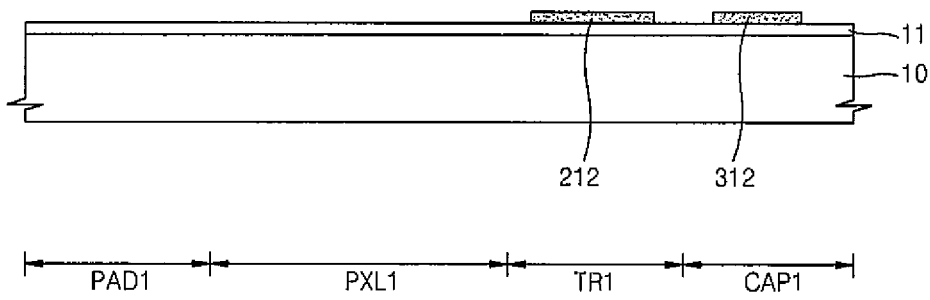
FIGS. 2A through 2J are cross-sectional views for describing a method of manufacturing the organic light-emitting display apparatus of FIG. 1, according to an embodiment of the present invention.

FIG. 2A is a cross-sectional view for describing a first mask process of the organic light-emitting display apparatus 1.

Referring to FIG. 2A, the buffer layer 11 is formed on the substrate 10, a semiconductor layer is formed on the buffer layer 11, and the semiconductor layer is patterned to form the active layer 212 of the thin-film transistor and the first electrode 312 of the capacitor.

Although not shown in FIG. 2A, a photoresistor may be coated on the semiconductor layer, and then the semiconductor layer may be patterned via a photolithography process using a first photomask to form the active layer 212 and the first electrode 312. The first mask process via the photolithography process is performed through a series of processes, for example, exposing the semiconductor layer through the first photomask by using an exposure apparatus, developing, etching, and stripping or ashing the semiconductor layer.

The semiconductor layer may include amorphous silicon or polysilicon. The polysilicon may be formed by crystallizing the amorphous silicon. The amorphous silicon may be crystallized by any one of various suitable methods, such as a rapid thermal annealing (RTA) method, a solid phase crystallization (SPC) method, an eximer laser annealing (ELA) method, a metal induced crystallization (MIC) method, a metal induced lateral crystallization (MILC) method, and a sequential lateral solidification (SLS) method. Alternatively, the semiconductor layer may include an oxide semiconductor or an organic semiconductor.

Figure 2B:
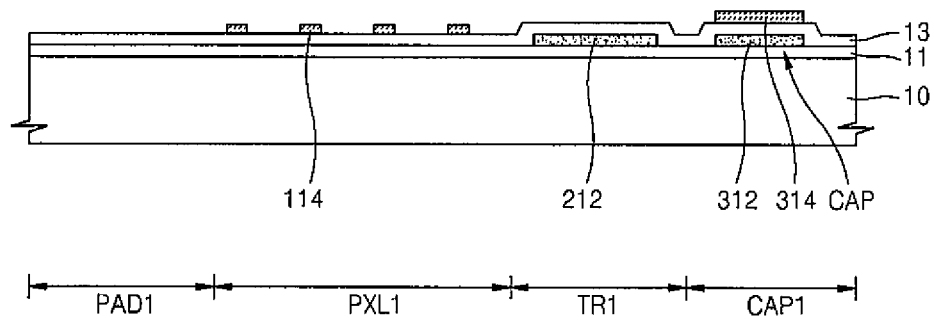

FIG. 2B is a cross-sectional view for describing a second mask process of the organic light-emitting display apparatus 1.

The first insulating layer 13 is formed on a result product of the first mask process of FIG. 2A, and then a transparent conductive oxide layer is formed on the first insulating layer 13 to be patterned.

As a result of the patterning, the first optical characteristic adjusting layer 114 and the second electrode 314 of the capacitor are formed on the first insulating layer 13. The first optical characteristic adjusting layer 114 is patterned into an island pattern, instead of an integrated pattern.

Figure 2C:
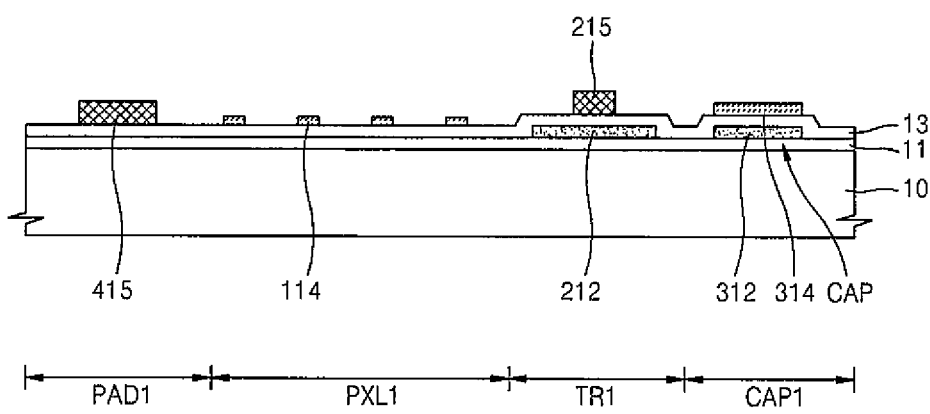

FIG. 2C is a cross-sectional view for describing a third mask process of the organic light-emitting display apparatus 1.

A first metal layer is stacked on a resultant product of the second mask process of FIG. 2B, and then is patterned. The first metal layer may be a single layer or a multiple layer of at least one metal selected from among Al, Pt, Pd, Ag, Mg, Au, Ni, Nd, Ir, Cr, Li, Ca, Mo, Ti, W, and Cu.

As a result of the patterning, the gate electrode 215 and the third pad layer 415 are formed on the first insulating layer 13.

Figure 2D:
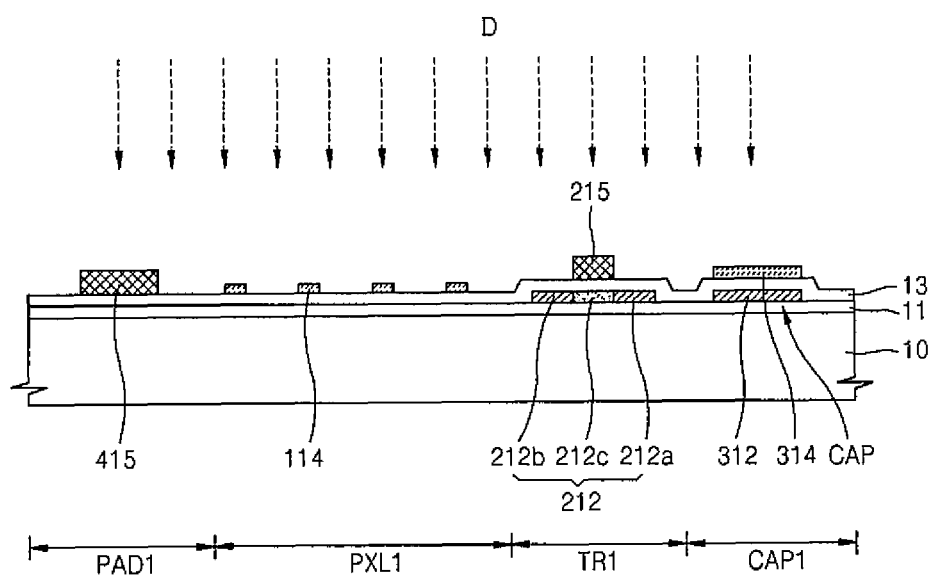

FIG. 2D is a cross-sectional view for describing a doping process of the organic light-emitting display apparatus 1.

An ion impurity is doped (D) on a resultant product of the third mask process of FIG. 2C. B- or P-ions may be doped as the ion impurity, and at this time, the ion impurity is doped targeting the active layer 212 of the thin-film transistor and the first electrode 312 of the capacitor at concentration equal to or higher than $1 \times 10^{15}$ atoms/cm$^2$.

The ion impurity is doped on the active layer 212 by using the gate electrode 215 as a self-align mask. The active layer 212 includes the source and drain regions 212a and 212b on which the ion impurity is doped, and the channel region 212c disposed between the source and drain regions 212a and 212b. The ion impurity is also doped on the first electrode 312 of the capacitor, and the first electrode 312 forms a metal-insulator-metal (MIM) capacitor together with the second electrode 314.

Accordingly, not only the active layer 212, but also the first electrode 312 of the capacitor are concurrently or simultaneously doped via one doping process, and thus, the number of doping processes is reduced, thereby reducing the manufacturing costs.

Figure 2E:
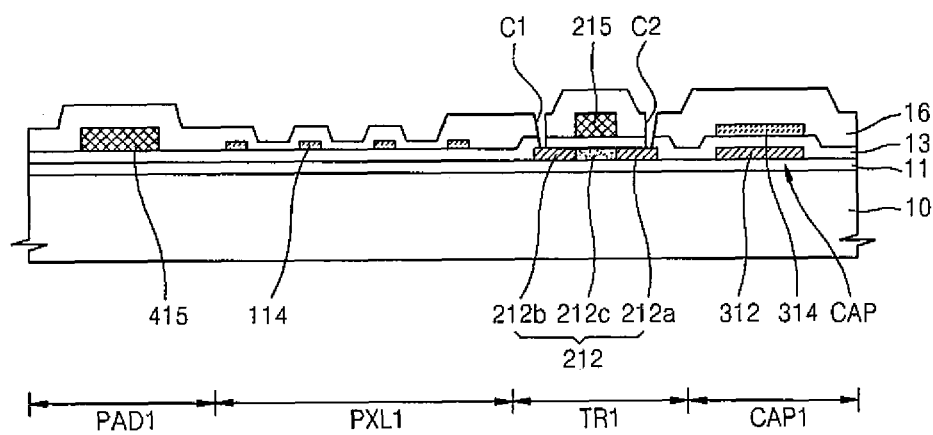

FIG. 2E is a cross-sectional view for describing a fourth mask process of the organic light-emitting display apparatus 1.

Referring to FIG. 2E, the second insulating layer 16 is formed on a result product of the doping process of FIG. 2D, and the second insulating layer 16 is patterned to form openings C1 and C2 for exposing the source and drain regions 212a and 212b of the active layer 212.

Figure 2F:
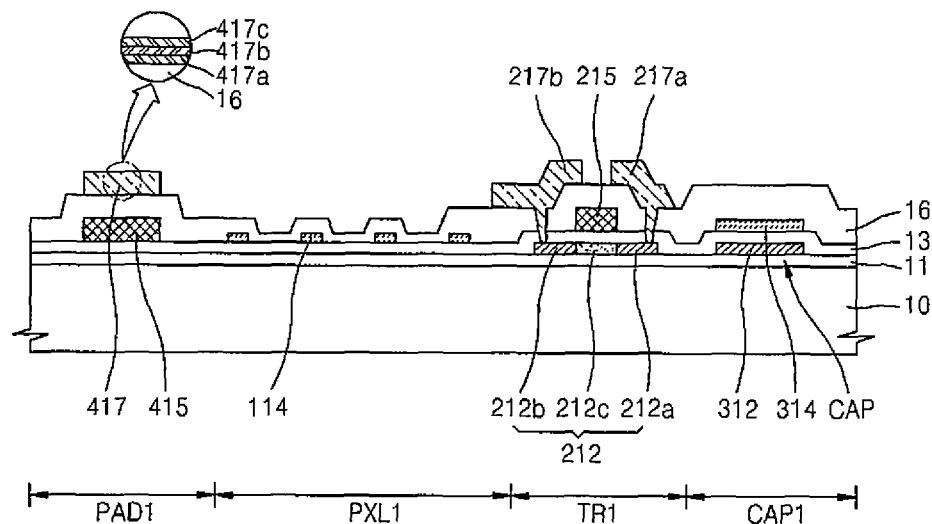

FIG. 2F is a cross-sectional view for describing a fifth mask process of the organic light-emitting display apparatus 1.

Referring to FIG. 2F, a second metal layer is formed on a resultant product of the fourth mask process of FIG. 2E, and the second metal layer is patterned to concurrently or simultaneously form the source and drain electrodes 217a and 217b, and the first pad layer 417 of a pad electrode.

The second metal layer may include at least two layers of different kinds of metals having different electron mobility. For example, at least two layers of metals selected from among Al, Pt, Pd, Ag, Mg, Au, Ni, Nd, Ir, Cr, Li, Ca, Mo, Ti, W, Cu, and alloys thereof.

In order to exemplarily show a structure of the second metal layer, a structure of the first pad layer 417 is shown in detail. For example, the second metal layer may include a first layer 417a including Mo, a second layer 417b including Al, and a third layer 417c including Mo.

The second layer 417b including Al is a metal layer having a small resistance and an excellent electric characteristic, the first layer 417a including Mo and disposed below the second layer 417b reinforces an adhesive strength between the second layer 417b and the second insulating layer 16, and the third layer 417c including Mo and disposed on the second layer 417b may operate as a barrier layer for preventing heel lock, oxidization, and diffusion of Al included in the second layer 417b.

Although not shown in FIG. 2F in detail, a data wire may be also formed by patterning the second metal layer during the fifth mask process.

Figure 2G:
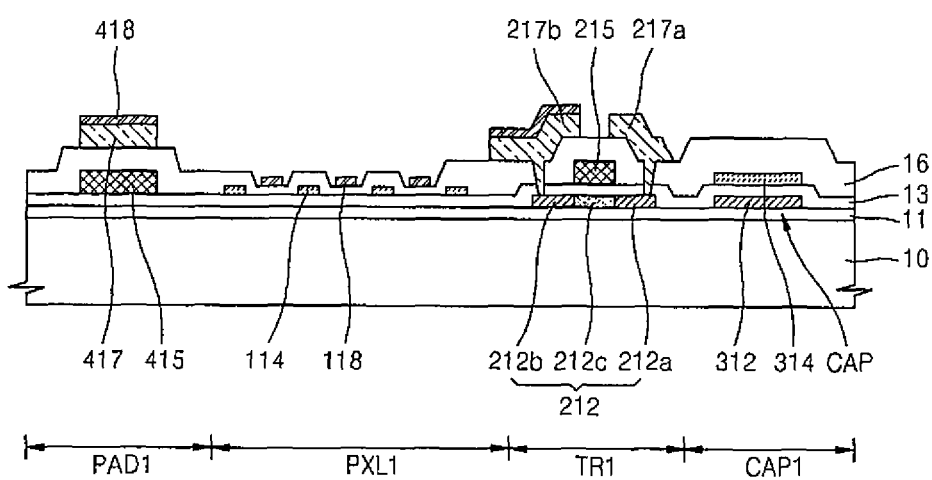

FIG. 2G is a cross-sectional view for describing a sixth mask process of the organic light-emitting display apparatus 1.

Referring to FIG. 2G, a third metal layer is formed on a resultant product of the fifth mask process of FIG. 2F, and the third metal layer is patterned to concurrently or simultaneously form the second pad layer 418 of the pad electrode, and the second optical characteristic adjusting layer 118.

The third metal layer may be a transparent conductive oxide layer.

The second optical characteristic adjusting layer 118 may be patterned into an island pattern as described above. The island pattern of the first optical characteristic adjusting layer 114 and the island pattern of the second optical characteristic adjusting layer 118 may be formed not to overlap each other.

Figure 2H:
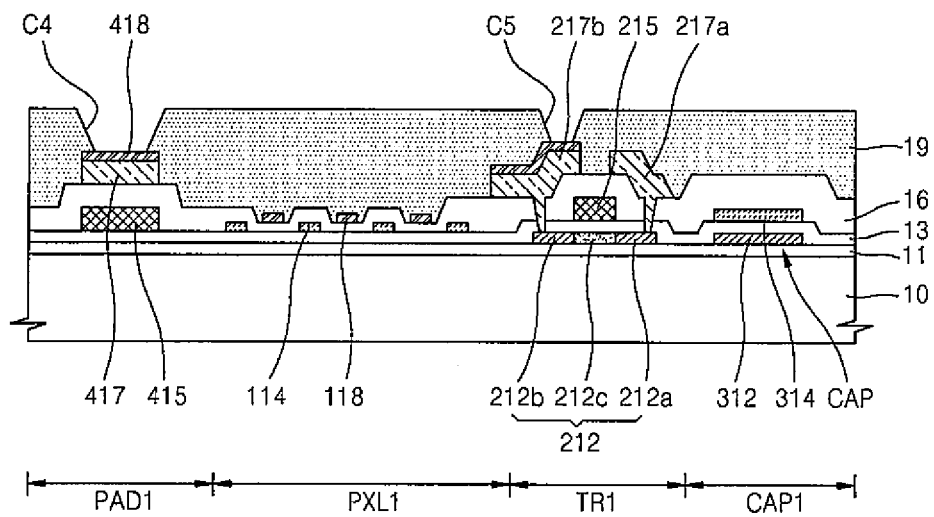

FIG. 2H is a cross-sectional view for describing a seventh mask process of the organic light-emitting display apparatus 1.

Referring to FIG. 2H, the third insulating layer 19 is formed on a resultant product of the sixth mask process of FIG. 2G, and the third insulating layer 19 is patterned to form a contact hole C5 for exposing a top of the drain electrode 217b and a contact hole C4 for exposing a top of the second pad layer 418.

The third insulating layer 19 may be formed to completely surround the source and drain electrodes 217a and 217b, and the second pad layer 418, so as to prevent different kinds of wires having different potential differences from contacting an etchant in which Ag ions are dissolved while etching the pixel electrode 120 including Ag.

Figure 2I:
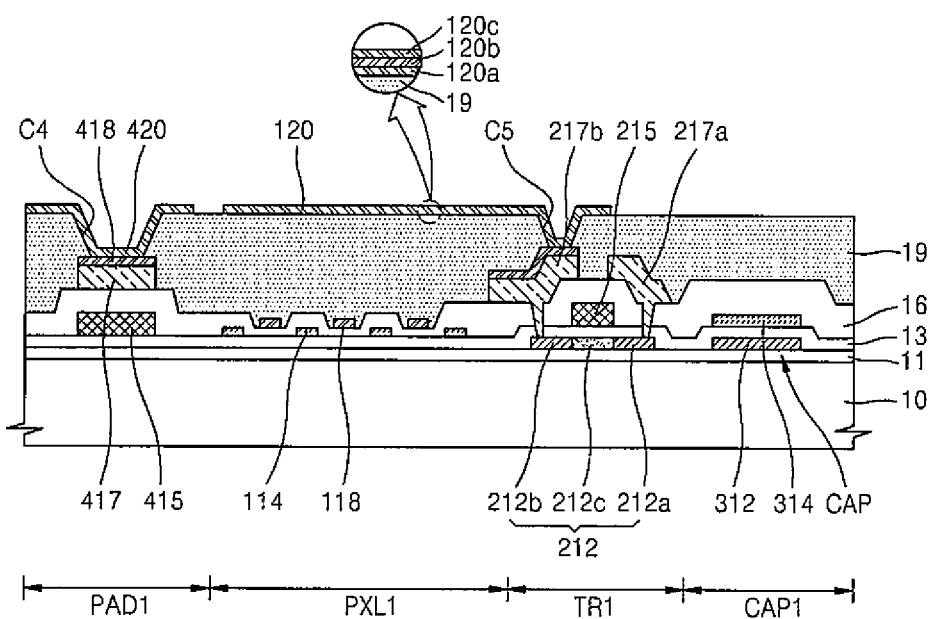

FIG. 2I is a cross-sectional view for describing an eighth mask process of the organic light-emitting display apparatus 1.

Referring to FIG. 2I, a semi-transmissive metal layer is formed on a resultant product of the seventh mask process of FIG. 2H, and the semi-transmissive metal layer is patterned to form the pixel electrode 120. The fourth pad layer 420 may be formed on the second pad layer 418.

The pixel electrode 120 is formed to include the semi-transmissive metal layer 120b. Also, the pixel electrode 120 may further include the transparent conductive oxide layers 120a and 120c for protecting the semi-transmissive metal layer 120b by being formed respectively on top and bottom of the semi-transmissive metal layer 120b. The semi-transmissive metal layer 120b forms a micro-cavity structure together with the counter electrode 122 that is a reflective electrode, thereby improving the light efficiency of the organic light-emitting display apparatus 1.

When a metal having strong reducibility, such as Ag, receives electrons during an etching process for patterning the pixel electrode 120, Ag ions existing in ion states in an etchant may be precipitated again as Ag. However, in the current embodiment, since the source or drain electrode 217a or 217b is pre-patterned before the eighth mask process of patterning the pixel electrode 120 and is covered by the third insulating layer 19 that is an organic film, the source or drain electrode 217a or 217b is not exposed to the etchant including Ag ions while etching the pixel electrode 120 including Ag. Accordingly, particle defects caused by re-precipitation of Ag may be prevented.

Figure 2J:
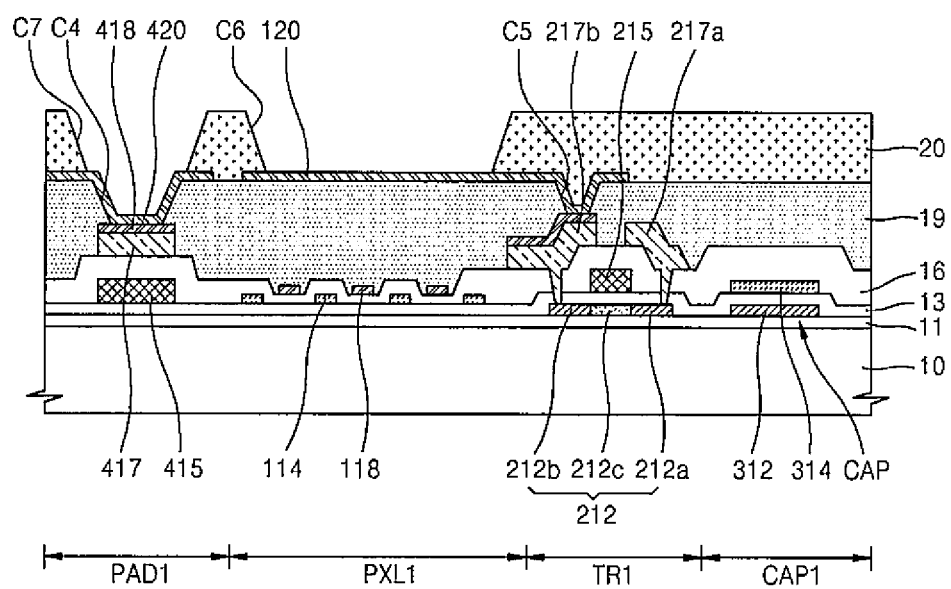

FIG. 2J is a cross-sectional view for describing a ninth mask process of the organic light-emitting display apparatus 1.

Referring to FIG. 2J, the fourth insulating layer 20 is formed on a resultant product of the eighth mask process of FIG. 2I, and then the ninth mask process is performed to form the opening C6 for exposing the top of the pixel electrode 120 and an opening C7 for exposing the fourth pad layer 420.

The fourth insulating layer 20 operates as a pixel define layer, and for example, may be an organic insulating film including a general commercial polymer (PMMA or PS), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, and a blend thereof.

The organic emission layer 121 of FIG. 1 is formed on a resultant product of the ninth mask process of FIG. 2J, and the counter electrode 122 of FIG. 1 is formed on the organic emission layer 121.

According to the method of the current embodiment, first and second optical characteristic adjusting layers are formed without an additional mask process, and thus, the organic light-emitting display apparatus 1 has excellent light efficiency and excellent color reproducibility.

Organic light-emitting display apparatuses according to other embodiments of the present invention will now be described with reference to FIGS. 3 through 7, based on the differences from the organic light-emitting display apparatus 1 of FIG. 1.

Figure 3:
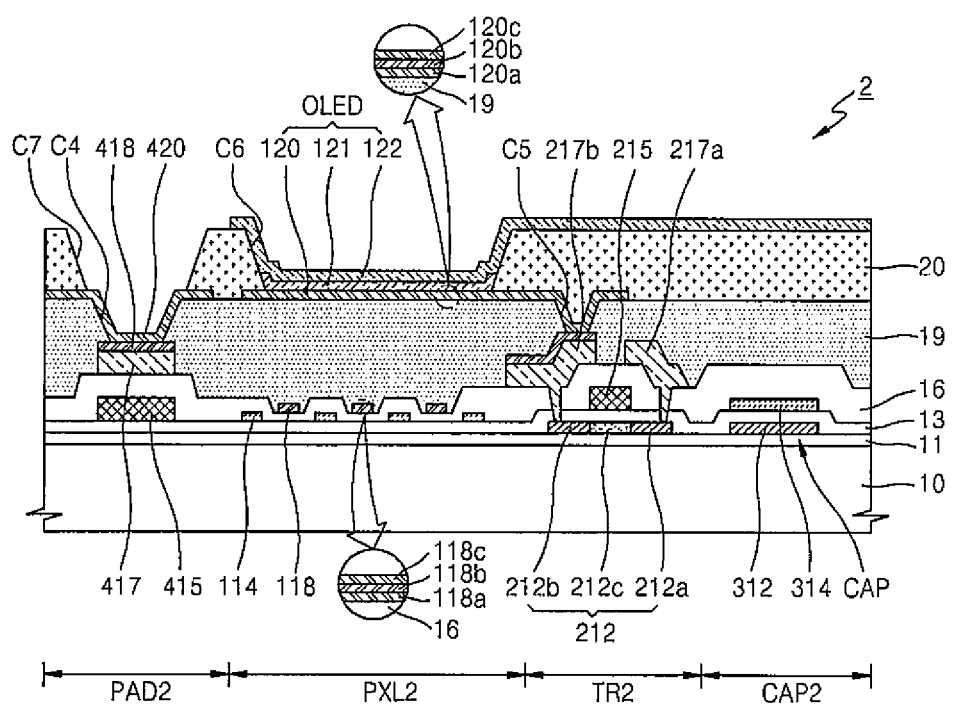
FIG. 3 is a cross-sectional, view of an organic light-emitting display apparatus according to another embodiment of the present invention.

FIG. 3 is a cross-sectional view of an organic light-emitting display apparatus 2 according to another embodiment of the present invention.

Referring to FIG. 3, the organic light-emitting display apparatus 2 according to the current embodiment includes a pixel region PXL2 including at least one organic light-emitting diode OLED on the substrate 10, a transistor region TR2 including at least one thin-film transistor, a capacitor region CAP2 including at least one capacitor, and a pad region PAD2.

Like the previous embodiment, the pixel electrode 120 according to the current embodiment includes a semi-transmissive material. In detail, the pixel electrode 120 includes the semi-transmissive metal layer 120b. The transparent conductive oxide layers 120a and 120c may be further disposed respectively on top and bottom of the semi-transmissive metal layer 120b. The counter electrode 122 is a reflective electrode including a reflective material. Like the organic light-emitting display apparatus 1, the organic light-emitting display apparatus 2 according to the current embodiment may have high light efficiency due to use of a strong resonance phenomenon between the pixel electrode 120 that is a semi-transmissive electrode and the counter electrode 122 that is a reflective electrode.

The first and second optical characteristic adjusting layers 114 and 118 are disposed on a path of a light emitted from the organic emission layer 121, between the pixel electrode 120 and the substrate 10.

In the current embodiment, the first optical characteristic adjusting layer 114 may be patterned into an island pattern and formed of a transparent conductive oxide like the previous embodiment.

Unlike the previous embodiment, the second optical characteristic adjusting layer 118 includes a semi-transmissive material. In detail, the second optical characteristic adjusting layer 118 includes a semi-transmissive metal layer 118b. Transparent conductive oxide layers 118a and 118c may be further disposed respectively on top and bottom of the semi-transmissive metal layer 118b. Unlike the previous embodiment, the light efficiency is increased since a strong resonance phenomenon is additionally generated between the semi-transmissive metal layer 118b of the second optical characteristic adjusting layer 118 and the counter electrode 122 that is a reflective electrode.

Also, color reproducibility of the organic light-emitting display apparatus 2 is excellent since a weak resonance phenomenon is used as a plurality of structures having different refractive indexes, for example, the buffer layer 11, the first insulating layer 13, the first optical characteristic adjusting layer 114, and the third insulating layer 19, are formed between the pixel electrode 120 and the substrate 10.

Figure 4:
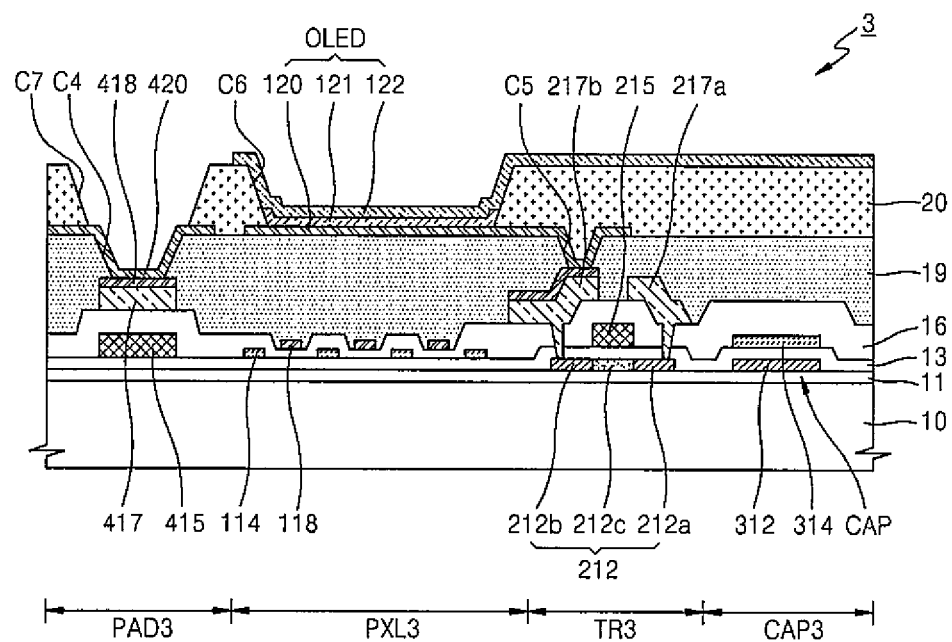
FIG. 4 is a cross-sectional view of an organic light-emitting display apparatus according to another embodiment of the present invention.

FIG. 4 is a cross-sectional view of an organic light-emitting display apparatus 3 according to another embodiment of the present invention.

Referring to FIG. 4, the organic light-emitting display apparatus 3 according to the current embodiment includes a pixel region PXL3 including at least one organic light-emitting diode OLED on the substrate 10, a transistor region TR3 including at least one thin-film transistor, a capacitor region CAP3 including at least one capacitor, and a pad region PAD3.

In the current embodiment, the pixel electrode 120 does not include a semi-transmissive material unlike the previous embodiments. In other words, the pixel electrode 120 includes a transparent conductive oxide. Accordingly, a weak resonance phenomenon is generated between the pixel electrode 120, that is, a transparent electrode, and the counter electrode 122, that is, a reflective electrode, instead of a strong resonance phenomenon. Accordingly, a color shift caused by a strong resonance phenomenon may be prevented.

In the previous embodiments, when a metal having strong reducibility, such as Ag, forming the semi-transmissive metal layer 120b receives electrons during an etching process for patterning the pixel electrode 120, Ag ions existing in ion states in an etchant may be precipitated again to Ag. The precipitated Ag may cause particle defects that generate a dark spot during a following process for forming the pixel electrode 120. However, in the current embodiment, since a semi-transmissive metal layer is not used, a particle defect caused by Ag may be prevented.

The first and second optical characteristic adjusting layers 114 and 118 are disposed on a path of light emitted from the organic emission layer 121 between the pixel electrode 120 and the substrate 10. The structures of the first and second optical characteristic adjusting layers 114 and 118 of FIG. 3 are identical to those of FIG. 1. Thus, a weak resonance phenomenon may be used.

Although the organic light-emitting display apparatus 3 according to the current embodiment does not use a strong resonance phenomenon, triple weak resonance phenomena between the counter electrode 122 and the pixel electrode 120, between the counter electrode 122 and the second optical characteristic adjusting layer 118, and between the counter electrode 122 and the first optical characteristic adjusting layer 114 may be used to prevent a color shift and increase light efficiency.

Figure 5:
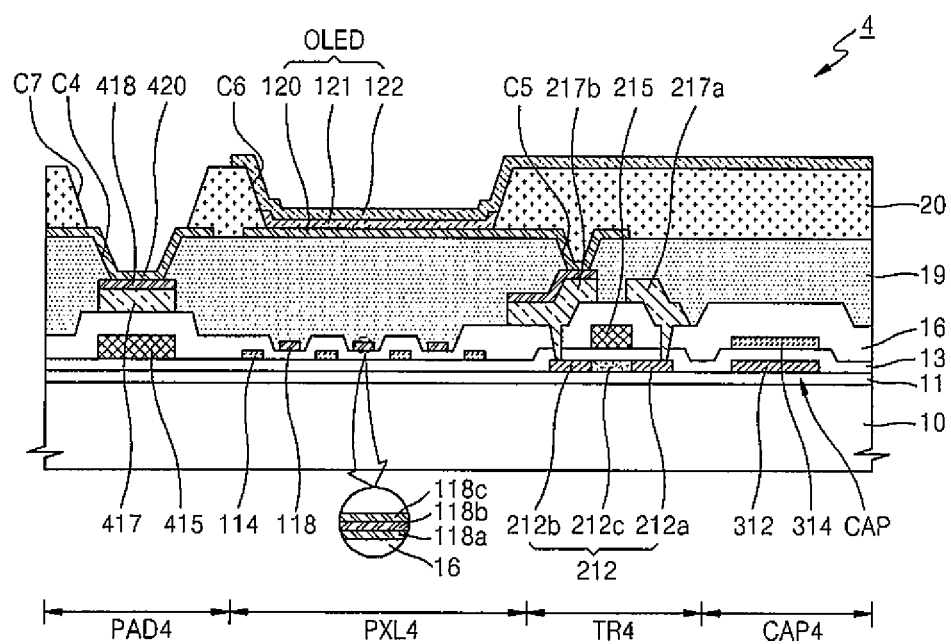
FIG. 5 is a cross-sectional view of an organic light-emitting display apparatus according to another embodiment of the present invention.

FIG. 5 is a cross-sectional view of an organic light-emitting display apparatus 4 according to another embodiment of the present invention.

Referring to FIG. 5, the organic light-emitting display apparatus 4 according to the current embodiment includes a pixel region PXL4 including at least one organic light-emitting diode OLED on the substrate 10, a transistor region TR4 including at least one thin-film transistor, a capacitor region CAP4 including at least one capacitor, and a pad region PAD4.

In the current embodiment, the pixel electrode 120 does not include a semi-transmissive material as the previous embodiment. In other words, the pixel electrode 120 includes a transparent conductive oxide. Accordingly, a weak resonance phenomenon is generated between the pixel electrode 120 that is a transparent electrode and the counter electrode 122 that is a reflective electrode, instead of a strong resonance phenomenon. Thus, a color shift caused by a strong resonance phenomenon may be prevented. Also, since a semi-transmissive metal layer is not used in the current embodiment, particle defects caused by Ag may be prevented.

The first and second optical characteristic adjusting layers 114 and 118 are disposed on a path of light emitted from the organic emission layer 121 between the pixel electrode 120 and the substrate 10.

Structures of the first and second optical characteristic adjusting layers 114 and 118 are the same as those of FIG. 3. In other words, the first optical characteristic adjusting layer 114 includes a transparent conductive oxide, and the second optical characteristic adjusting layer 118 includes a semi-transmissive material. In detail, the second optical characteristic adjusting layer 118 includes the semi-transmissive metal layer 118b. The transparent conductive oxide layers 118a and 118c may be further disposed respectively on top and bottom of the semi-transmissive metal layer 118b.

The organic light-emitting display apparatus 4 according to the current embodiment may not have a color shift and may have high light efficiency by trebly using a weak resonance phenomenon between the counter electrode 122 and the pixel electrode 120, a strong resonance phenomenon between the counter electrode 122 and the second optical characteristic adjusting layer 118, and a weak resonance phenomenon between the counter electrode 122 and the first optical characteristic adjusting layer 114.

Figure 6:
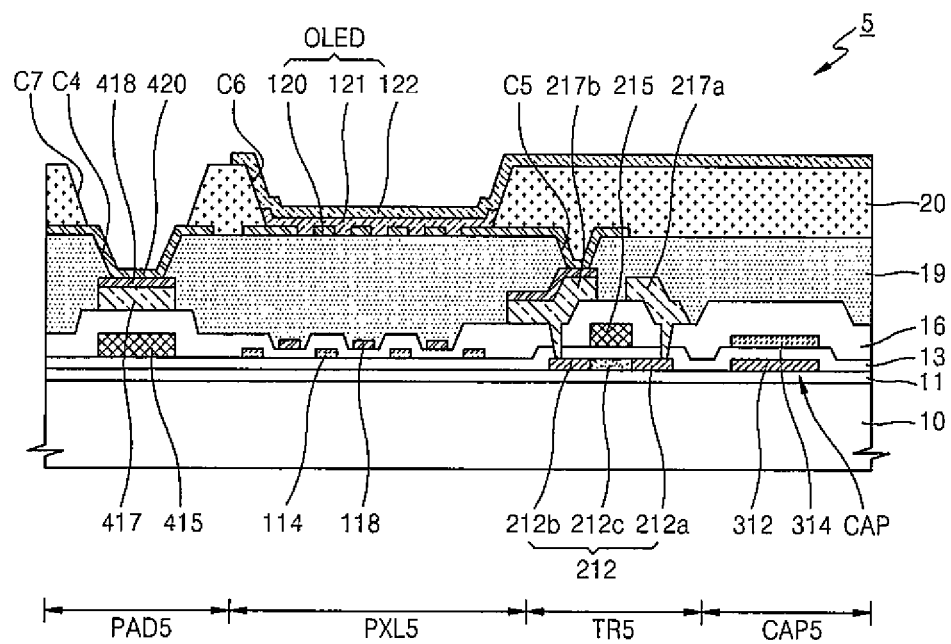
FIG. 6 is a cross-sectional view of an organic light-emitting display apparatus according to another embodiment of the present invention.

FIG. 6 is a cross-sectional view of an organic light-emitting display apparatus 5 according to another embodiment of the present invention.

Referring to FIG. 6, the organic light-emitting display apparatus 5 according to the current embodiment includes a pixel region PXL5 including at least one organic light-emitting diode OLED on the substrate 10, a transistor region TR5 including at least one thin-film transistor, a capacitor region CAP5 including at least one capacitor, and a pad region PAD5.

The organic light-emitting display apparatus 5 according to the current embodiment has the same structure as the organic light-emitting display apparatus 4 of FIG. 5, except for a shape of the pixel electrode 120. The pixel electrode 120 is patterned into a mesh pattern to prevent a color shift.

Meanwhile, in FIG. 6, the pixel electrode 120 is a transparent electrode, but the current embodiment of the present invention is not limited thereto. In other words, the pixel electrode 120 may be a semi-transmissive electrode patterned into a mesh pattern as shown in FIGS. 1 and 3.

Figure 7:
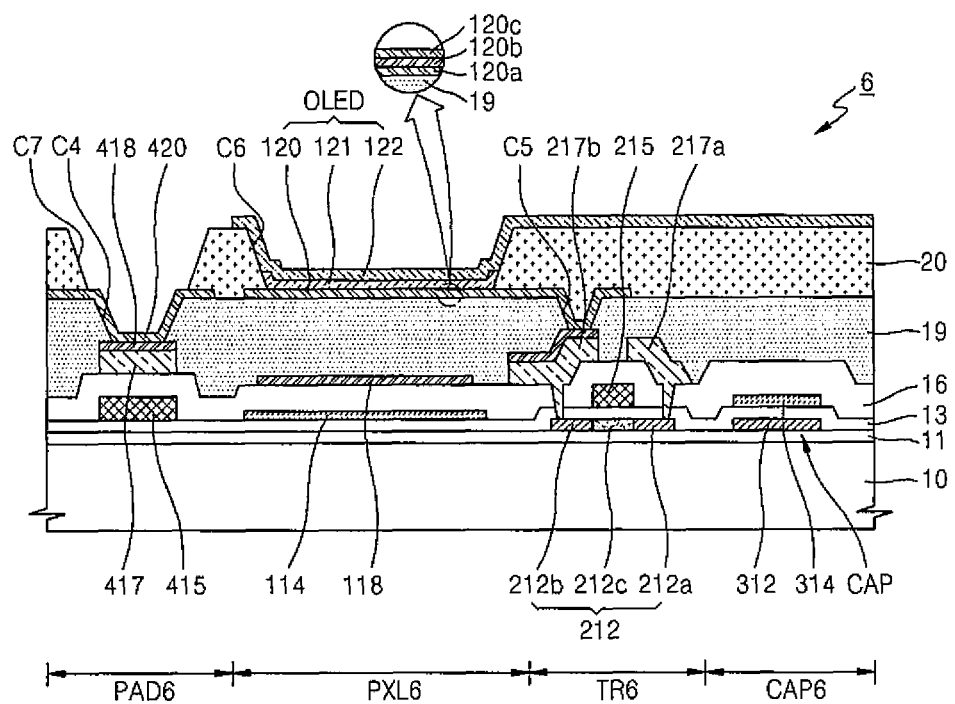
FIG. 7 is a cross-sectional view of an organic light-emitting display apparatus according to another embodiment of the present invention.

FIG. 7 is a cross-sectional view of an organic light-emitting display apparatus 6 according to another embodiment of the present invention.

Referring to FIG. 7, the organic light-emitting display apparatus 6 according to the current embodiment includes a pixel region PXL6 including at least one organic light-emitting diode OLED on the substrate 10, a transistor region TR6 including at least one thin-film transistor, a capacitor region CAPE including at least one capacitor, and a pad region PAD6.

The organic light-emitting display apparatus 6 has the same structure as the organic light-emitting display apparatus 5 of FIG. 6, except for shapes of the pixel electrode 120, the first optical characteristic adjusting layer 114, and the second optical characteristic adjusting layer 118. The pixel electrode 120, the first optical characteristic adjusting layer 114, and the second optical characteristic adjusting layer 118 are not patterned but are integrally formed. Accordingly, a patterning space is not required, and thus, manufacturing processes are easily performed.

Meanwhile, the pixel electrode 120 of FIG. 7 is a transparent electrode, but the current embodiment of the present invention is not limited thereto. In other words, the pixel electrode 120 may be a semi-transmissive electrode. Also, in FIG. 7, the second optical characteristic adjusting layer 118 is a transparent electrode, but an embodiment of the present invention is not limited thereto. In other words, the second optical characteristic adjusting layer 118 may be a semi-transmissive electrode.

As described above, according to the one or more of the above embodiments of the present invention, an organic light-emitting display apparatus has high light efficiency and excellent color reproducibility.

It should be understood that the exemplary embodiments described therein should be considered in a descriptive sense only and not for purposes of limitation. Descriptions of features or aspects within each embodiment should typically be considered as available for other similar features or aspects in other embodiments. While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
   a substrate;
   at least one thin-film transistor on the substrate;
   at least one capacitor on the substrate and comprising a first electrode and a second electrode;
   a pixel electrode connected to the at least one thin-film transistor;
   a counter electrode facing the pixel electrode and comprising a reflective material;
   an organic emission layer between the pixel electrode and the counter electrode;
   a first optical characteristic adjusting layer between the substrate and the pixel electrode and formed on a same layer as the second electrode of the at least one capacitor; and
   a second optical characteristic adjusting layer between the first optical characteristic adjusting layer and the pixel electrode.

2. The organic light-emitting display apparatus of claim 1, wherein the pixel electrode comprises a semi-transmissive material.

3. The organic light-emitting display apparatus of claim 1, wherein the pixel electrode comprises a transparent material.

4. The organic light-emitting display apparatus of claim 1, wherein the pixel electrode is patterned into a mesh pattern.

5. The organic light-emitting display apparatus of claim 1, wherein the first optical characteristic adjusting layer comprises a transparent conductive oxide.

6. The organic light-emitting display apparatus of claim 1, wherein the first optical characteristic adjusting layer comprises a same material as the second electrode of the at least one capacitor.

7. The organic light-emitting display apparatus of claim 1, wherein the first optical characteristic adjusting layer is patterned into an island pattern.

8. The organic light-emitting display apparatus of claim 1, wherein the second optical characteristic adjusting layer comprises a semi-transmissive material.

9. The organic light-emitting display apparatus of claim 1, wherein the second optical characteristic adjusting layer comprises a transparent material.

10. The organic light-emitting display apparatus of claim 1, wherein the second optical characteristic adjusting layer is patterned into an island pattern.

11. The organic light-emitting display apparatus of claim 1, further comprising a first pad layer and a second pad layer on the first pad layer,
wherein the second optical characteristic adjusting layer is on a same layer as the second pad layer.

12. The organic light-emitting display apparatus of claim 11, wherein the second optical characteristic adjusting layer comprises a same material as the second pad layer.

13. The organic light-emitting display apparatus of claim 1, wherein the pixel electrode, the first optical characteristic adjusting layer, and the second optical characteristic adjusting layer are on a path of light emitted from the organic emission layer.

14. The organic light-emitting display apparatus of claim 1, wherein the at least one thin-film transistor comprises an active layer, a gate electrode, source and drain electrodes, a first insulating layer between the active layer and the gate electrode, and a second insulating layer between the gate electrode and the source and drain electrodes,
wherein the active layer is on a same layer as the first electrode of the at least one capacitor, and
the gate electrode is on a same layer as the second electrode of the at least one capacitor.

15. The organic light-emitting display apparatus of claim 14, wherein the second insulating layer is between the first optical characteristic adjusting layer and the second optical characteristic adjusting layer.

16. The organic light-emitting display apparatus of claim 14, wherein a third insulating layer is between the pixel electrode and the source and drain electrodes, and the third insulating layer is between the second optical characteristic adjusting layer and the pixel electrode.

17. A method of manufacturing an organic light-emitting display apparatus, the method comprising:
forming an active layer of a thin-film transistor and a first electrode of a capacitor on a substrate;
forming a first optical characteristic adjusting layer and a second electrode of the capacitor;
forming a gate electrode of the thin-film transistor;
forming source and drain electrodes of the thin-film transistor and a first pad layer;
forming a second optical characteristic adjusting layer and a second pad layer;
forming a pixel electrode connected to one of the source and drain electrodes;
forming an organic emission layer on the pixel electrode; and
forming a counter electrode on the organic emission layer.

18. The method of claim 17, further comprising doping ion impurities on the active layer and the first electrode of the capacitor.

19. The method of claim 18, wherein the ion impurities are doped after forming the gate electrode.

20. The method of claim 17, wherein the first optical characteristic adjusting layer and the second electrode of the capacitor are formed of a transparent material.

21. The method of claim 17, wherein the first optical characteristic adjusting layer is patterned into an island pattern.

22. The method of claim 17, wherein the second optical characteristic adjusting layer and the second pad layer are formed of a semi-transmissive material.

23. The method of claim 17, wherein the second optical characteristic adjusting layer and the second pad layer are formed of a transparent material.

24. The method of claim 17, wherein the second optical characteristic adjusting layer is patterned into an island pattern.

25. The method of claim 17, wherein the pixel electrode is patterned into an island pattern.

26. The method of claim 17, wherein the pixel electrode is formed of a semi-transmissive material.

27. The method of claim 17, wherein the pixel electrode is formed of a transparent material.

28. The method of claim 17, wherein the counter electrode is formed of a reflective material.

* * * * *